United States Patent
Yeh et al.

(10) Patent No.: US 8,106,610 B2
(45) Date of Patent: Jan. 31, 2012

(54) HEAT DISSIPATION DEVICE AND FAN MODULE THEREOF

(75) Inventors: Jung-Tai Yeh, Taipei Hsien (TW); Chien-Nan Chen, Taipei Hsien (TW)

(73) Assignee: ACBEL Polytech Inc., Taipei Hsien (TW)

( * ) Notice: Subject to any disclaimer, the term of this patent is extended or adjusted under 35 U.S.C. 154(b) by 412 days.

(21) Appl. No.: 12/457,613

(22) Filed: Jun. 17, 2009

(65) Prior Publication Data

US 2010/0109591 A1 May 6, 2010

(30) Foreign Application Priority Data

Oct. 30, 2008 (TW) .................................. 97141716 A

(51) Int. Cl.
*H02P 7/29* (2006.01)
(52) U.S. Cl. ........................ 318/268; 318/463; 318/471
(58) Field of Classification Search .................. 318/268, 318/461, 463, 471–473, 490, 491
See application file for complete search history.

(56) References Cited

U.S. PATENT DOCUMENTS

| 6,211,632 B1 * | 4/2001 | Liao .................................. 318/16 |
| 6,825,626 B2 * | 11/2004 | Peterson ........................ 318/434 |
| 7,224,137 B2 * | 5/2007 | Chiu et al. ..................... 318/376 |

* cited by examiner

*Primary Examiner* — Bentsu Ro
(74) *Attorney, Agent, or Firm* — Bacon & Thomas, PLLC

(57) ABSTRACT

A heat dissipation device has a main controller and a fan module having a motor coil, a connection interface, a PWM driving circuit and a fan monitor chip. The connection interface has a control pin, an error report pin, a power supply pin and a ground pin. The control pin receiving a control signal. The PWM driving circuit adjusts current magnitude and current direction of the motor coil to drive the fan module. The fan monitor chip is connected to the connection interface and the PWM driving circuit, receives the control signal, generates and sends PWM signals to the PWM driving circuit according to the control signal and sends an acknowledgement signal via the control pin after receiving the control signal. The main controller can check if the control signal is correctly received based on the acknowledge signal.

20 Claims, 4 Drawing Sheets

HEAT DISSIPATION DEVICE AND FAN MODULE THEREOF

BACKGROUND OF THE INVENTION

1. Field of the Invention

The present invention relates to a heat dissipation device, especially to a heat dissipation device that provides stable control signal to maintain stability of a rotation speed of a fan module of the heat dissipation device.

2. Description of the Related Art

A central processing unit (CPU) executes computer programs. When processing lots of data, the CPU generates large amounts of heat and requires effective cooling solutions. Usually a fan module is mounted upon the CPU to keep the CPU cool.

Since the CPU and the fan module are often disposed inside a computer, users cannot see whether the fan module is working properly or not. To solve the problem, with reference to FIG. 4, a motherboard (40) of a computer has a hardware monitor chip (42) that generates PWM (Pulse-width modulation) signals to control rotation speed of a fan module (30). The motherboard (40) has a main controller (41), such as a south-bridge chip, which gives out control signals to the hardware monitor chip (42). The hardware monitor chip (42) then changes pulse width of the PWM signals accordingly.

The fan module (30) has a motor coil (33), a connecting interface (32), a rotation speed meter (34) and a PWM driving circuit (31). The motor coil (33) may be a stator coil or a rotor coil depending on design requirements of the fan module (30). The rotation speed meter (34) may be implemented as an encoder. The connecting interface (32) includes a PWM pin (PWM), a rotation speed detect pin (Tach Out), a power supply pin (Vcc) and a ground pin (GND). The power supply pin (Vcc) and the ground pin (GND) are connected to the motherboard (40) to derive operation power from a power supply of a computer. The PWM pin (PWM) and the rotation speed detect pin (Tach Out) are connected to the hardware monitor chip (42). The PWM driving circuit (31) is electrically connected to the motor coil (33) and the PWM pin.

When receiving PWM signals from the hardware monitor chip (42) via the PWM pin, the PWM driving circuit (31) accordingly controls current magnitude and current direction of the motor coil (33) to drive the fan module (30). Meanwhile, the hardware monitor chip (42) receives the present rotation speed signal from the rotation speed detect pin (Tach Out) and accordingly computes the actual rotation speed of the fan module (30) as a basis for adjusting the rotation speed.

However, a large computer system often requires multiple fan modules to dissipate heat. With the foregoing method, communication between the hardware monitor chip (42) and the fan module (30) is unidirectional. The hardware monitor chip (42) gives out PWM signals to the fan module (30), but the fan module (30) does not automatically reply whether the received PWM signals are correct or not. Furthermore, in order to drive the fan modules (30), conductive path for transmitting a PWM signal is so long that the PWM signals are easily disturbed by outer noises. Once the PWM signal is disturbed with noises, the fan modules (30) may not work with a stable rotation speed and the main controller (41) cannot detect and react to such situation.

To overcome the shortcomings, the present invention provides a heat dissipation device to mitigate or obviate the aforementioned problems.

SUMMARY OF THE INVENTION

The main objective of the invention is to provide a heat dissipation device that provides stable control signals to maintain stability of the rotation speed of a fan module of the heat dissipation device.

To achieve the objective, the heat dissipation device in accordance with the present invention comprises a main controller and a fan module.

The main controller is mounted on a circuit board.

The fan module has a motor coil, a connection interface, a PWM driving circuit and a fan monitor chip. The connection interface is connected to the circuit board and has a control pin, an error report pin, a power supply pin and a ground pin. The control pin is electrically connected to the main controller and receives a control signal sent from the main controller. The error report pin is electrically connected to the main controller. The power supply pin and the ground pin derives operating power for the fan module.

The PWM driving circuit is electrically connected to the motor coil, adjusts current magnitude and current direction of the motor coil to drive the fan module and is connected to the power supply pin and ground pin of the connection interface to attain the operating power.

The fan monitor chip is electrically connected to the connection interface and the PWM driving circuit and attains operating power via the power supply pin and ground pin, receives the control signal via the control pin, generates and sends PWM signals to the PWM driving circuit according to the control signal and sends an acknowledgement signal to the main controller via the control pin after receiving the control signal, wherein the acknowledgement signal is provided for the main controller to check whether the fan monitor chip has received the control signal correctly.

Since the fan monitor chip and the main controller communicate with each other, the main controller can check if the control signal is correctly received based on the acknowledgement signal of the fan monitor chip. Once the control signal is disturbed by noises during transmission, the main controller can be aware of such situation and re-send the control signal to resist the noise disturbance and maintain the accuracy of the control signal to stabilize the rotation speed of the fan module.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
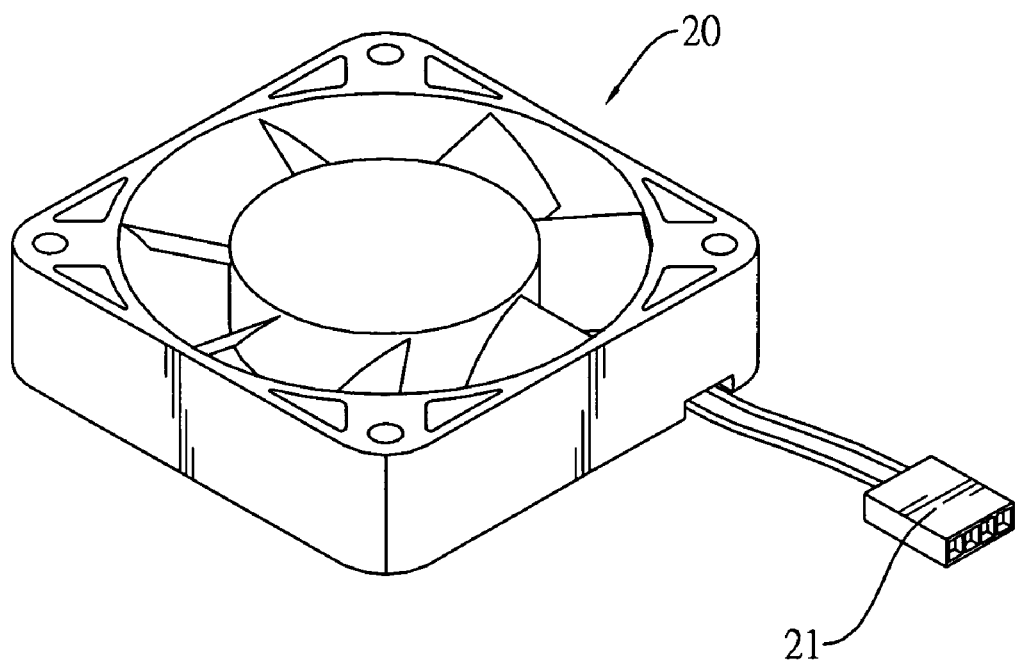
FIG. 1 is a perspective view of a fan module of a heat dissipation device in accordance with the present invention.
Figure 2:
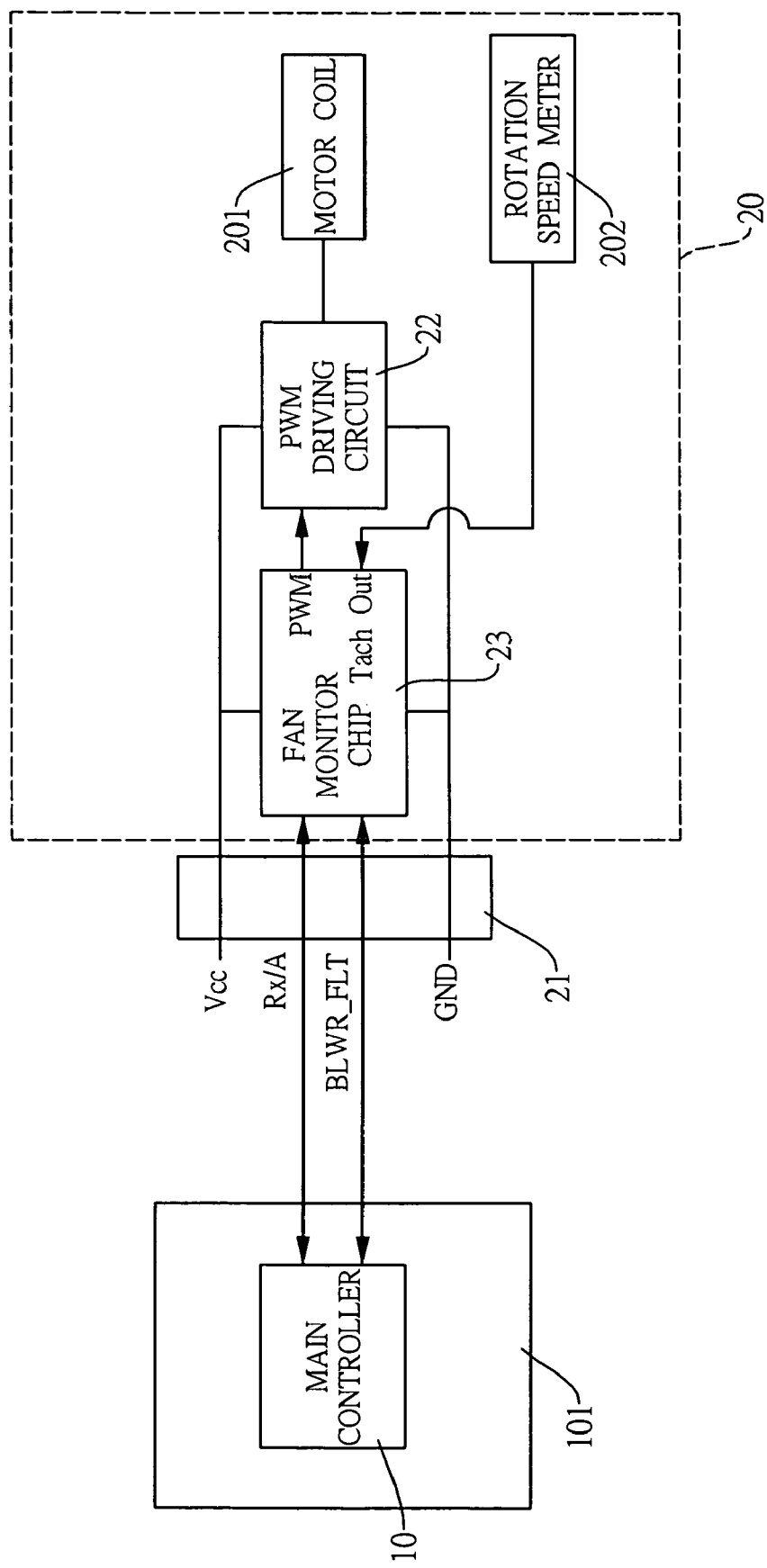
FIG. 2 is a block diagram of the heat dissipation device in accordance with the present invention.

With reference to FIGS. 1 and 2, a heat dissipation device in accordance with the present invention comprises a main controller (10) and a fan module (20).

The main controller (10) is mounted on a circuit board (101). When the heat dissipation device of the present invention is applied to computer, the circuit board (101) may be implemented as a motherboard of a computer.

The fan module (20) has a motor coil (201), an optional rotation speed meter (202), a connection interface (21), a PWM (Pulse-Width Modulation) driving circuit (22) and a fan monitor chip (23).

The connection interface (21) is connected to a socket of the circuit board (101) to electrically connect the circuit board (101) and the main controller (10). The connection interface (21) has a control pin (Rx/A), an error report pin (BLWR_FLT), a power supply pin (Vcc) and a ground pin (GND). The control pin (Rx/A) is electrically connected to the main controller (10) to receive a control signal sent from the main controller (10). The error report pin (BLWR_FLT) is electrically connected to the main controller (10). The power supply pin (Vcc) and the ground pin (GND) are electrically connected to a power supply of a computer to derive operating power for the fan module (20).

The PWM driving circuit (22) is electrically connected to the motor coil (201), changes current magnitude and current direction of the motor coil (201) to drive the fan module (20) and is connected to the power supply pin (Vcc) and the ground pin (GND) of the connection interface (21) to attain the operating power.

The fan monitor chip (23) is electrically connected to the connection interface (21), the rotation speed meter (202) and the PWM driving circuit (22). The fan monitor chip (23) is connected to the power supply pin (Vcc) and the ground pin (GND) and receives the control signal via the control pin (Rx/A). The fan monitor chip (23) generates and sends PWM signals to the PWM driving circuit (22) according to the control signal to drive the PWM driving circuit (22) to control rotation speed of the fan module (20). The fan monitor chip (23) calculates rotation speed of the fan module (20) via the rotation speed meter (202) and sends an error message to the main control (10) via the error report pin (GLWR_FLT) when the calculated rotation speed is irregular.

Besides, the fan monitor chip (23) may send an acknowledgement signal to the main controller (10) via the control pin (Rx/A) after receiving the control signal. The fan monitor chip (23) may store a high threshold value and a low threshold value of rotation speed to define the range of the rotation speed of the fan module (20). The main controller (10) is capable of waiting for the acknowledgement signal after sending out the control signal. In an embodiment of the present invention, data structure of the control signal comprises four byte data, wherein address data are written in the first byte, set command data are written in the second byte, command data are written in the third byte and checksum data are written in the fourth byte. The address data are for selecting a desired fan module (20). The set command data are for selecting an action for a corresponding fan monitor chip (23) of the desired fan module (20) to execute. The command data are for selecting corresponding data to write when the fan monitor chip (23) executes the action. The checksum data are for checking whether foregoing bytes of the data of the control signal are written correctly.

Figure 3:
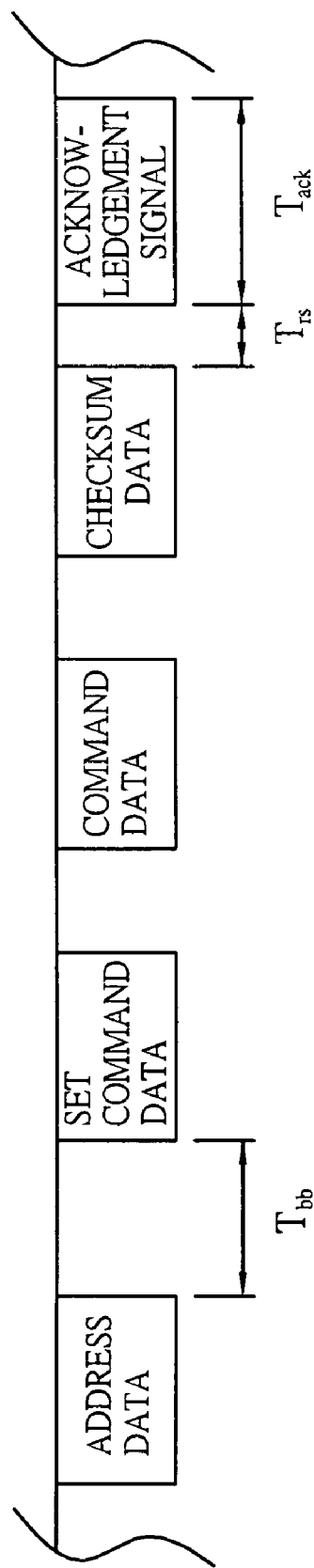
FIG. 3 is a flow chart of a control signal sent by a main controller of the heat dissipation device in accordance with the present invention.
Figure 4:
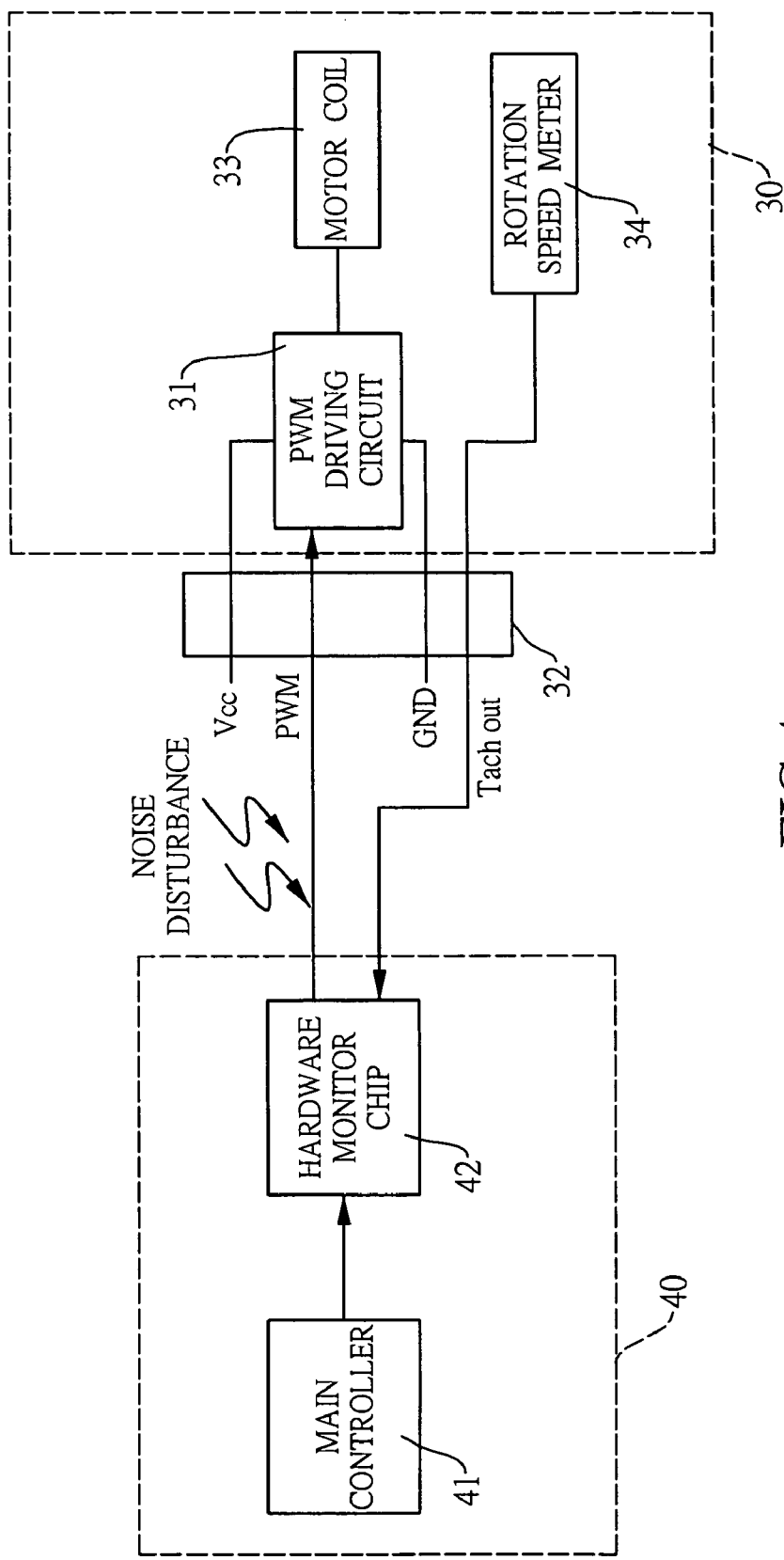
FIG. 4 is a block diagram of a conventional fan module coupling to a motherboard.

With further reference to FIG. 3, the main controller (10) serially sends address data, set command data, command data and checksum data to the fan monitor chip (23). Time interval of sending next data is 20 milliseconds. When receiving all data, the fan monitor chip (23) starts to calculate and check whether the received address data, set command data and command data correspond with the checksum data. If the received address data, set command data and command data correspond with the checksum data, the fan monitor chip (23) then sends an acknowledgement signal to the main controller (10) via the control pin (Rx/A). For example, set the control pin (Rx/A) in high voltage level to have the fan monitor chip (23) act as a data sending terminal and the main controller (10) act as a data receiving terminal. On the contrary, the fan monitor chip (23) does not return an acknowledge signal by setting the control pin (Rx/A) in low voltage level. After sending the checksum data, the main controller (10) waits for a response time ($T_{rs}$) being 2 milliseconds, then checks if the acknowledgement signal has been received for an acknowledge time ($T_{ack}$) being 10 milliseconds. Having been received the acknowledgement signal means the fan monitor chip (23) has received the correct control signal. Therefore, by checking acknowledgement signal has been received, the main controller (10) can confirm that the fan monitor chip (23) has already received the correct signal. If any signal disturbance occurs during transmission and makes the fan monitor chip (23) receive wrong control signal, the fan monitor chip (23) will not return the acknowledge signal. The main controller (10) will re-send the control signal after the acknowledge time ($T_{ack}$) runs out and repeat this step until the fan monitor chip (23) receive the correct control signal.

Besides, after calculating the rotation speed of the fan module (20), the fan monitor chip (23) then compares the calculated rotation speed with the high threshold value and the low threshold value. According to such result, the fan monitor chip (23) may respond in different ways.

If the rotation speed is higher than the high threshold value or lower than the low threshold value, the fan monitor chip (23) will send a high voltage level signal via the error report pin (BLWR_FLT). If the rotation speed lies between the high and low threshold values, the fan monitor chip (23) will send a low voltage level signal.

If the rotation speed is higher than the high threshold value, the fan monitor chip (23) will send a high voltage level signal via the error report pin (BLWR_FLT). If the rotation speed is lower than the low threshold value, the fan monitor chip (23) will send a low voltage level signal via the error report pin (BLWR_FLT). If the rotation speed lies between the high and low threshold values, the fan monitor chip (23) will not send any signal via the error report pin (BLWR_FLT).

The main controller (10) can react appropriately according to the high or low voltage level signal. The reaction can be flashing or performing warning sounds. Or the fan monitor chip (23) may be designed to send the rotation speed value of the fan module (20) as response via the error report pin (BLWR_FLT) instead of sending high or low voltage level signal.

EXAMPLES

When trying to adjust rotation speed of fan module (20), a user may execute a program inside the main controller (10) to make the main controller (10) send a control signal. The address data of the control signal are 0x00 that represent an assigned number "0" of a fan module (20) that is going to be controlled with the set command data and the command data of the control signal. The set command data are 0x54 that represent adjusting the rotation speed value. The command data are 0x99. Comparing 00H-FFH to 0%-100%, 0x99 represent 60% of a predetermined highest rotation value that the rotation speed of the fan module (20) is going to be adjusted to.

Example 2 when trying to adjust the low threshold value, the user may execute a program inside the main controller (10) to make the main controller (10) send a control signal. The address data of the control signal are 0x01 that represent an assigned number "1" of a fan module (20) that is going to be controlled with the set command data and the command data of the control signal. The set command data are 0x4C that represent adjusting the low threshold value. The command data are 0x5A. Comparing 1-bit to 40 rpm, 0x5A represent 3600 rpm that the low threshold value of the fan module (20) is going to be adjusted to.

Because the fan monitor chip (23) has ability to send PWM signals and calculate rotation speed of the fan module (20) and can achieve bi-directional communication with the main controller (10) via the control pin (Rx/A) of the connection interface (21), if the control signal is disturbed by noise during transmission, the main controller (10) is aware of such situation and re-sends new control signal to resist the noise and maintain accuracy of control signal to stabilize the rotation speed of the fan module (20). Besides, the circuit board (101) where the main controller (10) is mounted on is not equipped with a hardware monitor chip as the prior art is. Therefore when the circuit board (101) is implemented as a motherboard, this allows design costs and space occupied by the hardware monitor chip and peripheral circuit and wiring to be economized.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat dissipation device comprising:
    a main controller being mounted on a circuit board; and
    a fan module having
        a motor coil;
        a connection interface being connected to the circuit board and having
            a control pin electrically connected to the main controller and receiving a control signal sent from the main controller;
            an error report pin electrically connected to the main controller; and
            a power supply pin and a ground pin deriving operating power;
        a Pulse-Width Modulation (PWM) circuit being electrically connected to the motor coil, changing current magnitude and current direction of the motor coil to drive the fan module and being connected to the power supply pin and ground pin of the connection interface to attain the operating power; and
        a fan monitor chip being electrically connected to the connection interface and the PWM driving circuit, attaining operating power via the power supply pin and ground pin, receiving the control signal via the control pin, generating and sending PWM signals to the PWM driving circuit according to the control signal and sending an acknowledgement signal to the main controller via the control pin after receiving the control signal wherein the acknowledgement signal is provided for the main controller to check whether the fan monitor chip have received the control signal correctly.

2. The heat dissipation device as claimed in claim 1, wherein
    the fan module further has a rotation speed meter; and
    the fan monitor chip is connected to the rotation speed meter to detect rotation speed of the fan module and send an error message to the main controller via the error report pin when detecting the rotation speed is irregular.

3. The heat dissipation device as claimed in claim 2, wherein the fan monitor chip stores a high threshold value and sends the error message to the main controller via the error report pin when detecting that the rotation speed is higher than the high threshold value.

4. The heat dissipation device as claimed in claim 3, wherein the fan monitor chip sends a high-level electric signal as the error message.

5. The heat dissipation device as claimed in claim 3, wherein the fan monitor chip sends the rotation speed value as the error message.

6. The heat dissipation device as claimed in claim 2, wherein the fan monitor chip stores a low threshold value and sends the error message to the main controller via the error report pin when detecting that the rotation speed is lower than the low threshold value.

7. The heat dissipation device as claimed in claim 6, wherein the fan monitor chip sends a high-level electric signal as the error message.

8. The heat dissipation device as claimed in claim 6, wherein the fan monitor chip sends a low-level electric signal as the error message.

9. The heat dissipation device as claimed in claim 6, wherein the fan monitor chip sends the rotation speed value as the error message.

10. The heat dissipation device as claimed in claim 2, wherein the fan monitor chip sends the rotation speed value as the error message.

11. The heat dissipation device as claimed in claim 1, wherein the control signal sent from the main controller comprises four bytes data comprising:
    address data written in the first byte of the data of the control signal for selecting a desired fan module;
    set command data written in the second byte of the data of the control signal for selecting an action for a corresponding fan monitor chip of the fan module to execute;
    command data written in the third byte of the data of the control signal for selecting corresponding data for writing when the fan monitor chip executing the action; and
    checksum data written in the fourth byte of the data of the control signal for checking whether other bytes of the data of the control signal are written correctly.

12. A fan module comprising:
    a motor coil;
    a connection interface having
        a control pin receiving a control signal;
        an error report pin; and
        a power supply pin and a ground pin deriving an operating power; and
    a PWM (Pulse-Width Modulation) circuit being electrically connected to the motor coil, changing current magnitude and current direction of the motor coil to drive the fan module and being connected to the power supply pin and ground pin of the connection interface to derive the operating power; and
    a fan monitor chip connected to the connection interface and the PWM driving circuit and deriving operating power via the power supply pin and ground pin, receiving the control signal via the control pin, generating and sending PWM signals to the PWM driving circuit according to the control signal and send an acknowledgement signal via the control pin.

13. The fan module as claimed in claim 12, wherein
the fan module further has a rotation speed meter; and
the fan monitor chip is connected to the rotation speed meter to detect rotation speed of the fan module and sends an error message via the error report pin when detecting that the rotation speed is irregular.

14. The fan module as claimed in claim 13, wherein the fan monitor chip stores a high threshold value and sends the error message via the error report pin when detecting that the rotation speed is higher than the high threshold value.

15. The fan module as claimed in claim 14, wherein the fan monitor chip sends a high-level electric signal as the error message.

16. The fan module as claimed in claim 14, wherein the fan monitor chip sends the rotation speed value as the error message.

17. The fan module as claimed in claim 13, wherein the fan monitor chip stores a low threshold value and sends the error message via the error report pin when detecting that the rotation speed is lower than the low threshold value.

18. The fan module as claimed in claim 17, wherein the fan monitor chip sends a high-level electric signal as the error message.

19. The fan module as claimed in claim 17, wherein the fan monitor chip sends a low-level electric signal as the error message.

20. The fan module as claimed in claim 17, wherein the fan monitor chip sends the rotation speed value as the error message.

* * * * *